US011091051B2

(12) United States Patent
Bin et al.

(10) Patent No.: US 11,091,051 B2
(45) Date of Patent: Aug. 17, 2021

(54) COOLING CONTROL SYSTEM AND METHOD FOR AN ON-BOARD CHARGER OF A PLUG-IN VEHICLE

(71) Applicants: HYUNDAI MOTOR COMPANY, Seoul (KR); KIA MOTORS CORPORATION, Seoul (KR)

(72) Inventors: Seung Hyeon Bin, Busan (KR); Kil Young Youn, Suwon-si (KR); Sang Kyu Lee, Yongin-si (KR); Jae Hwa Jeon, Hwaseong-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 162 days.

(21) Appl. No.: 16/560,667

(22) Filed: Sep. 4, 2019

(65) Prior Publication Data

US 2020/0298718 A1 Sep. 24, 2020

(30) Foreign Application Priority Data

Mar. 18, 2019 (KR) .................. 10-2019-0030387

(51) Int. Cl.
*H02J 7/00* (2006.01)
*B60L 53/302* (2019.01)
*B60L 53/60* (2019.01)
*B60L 53/22* (2019.01)
*H05K 7/20* (2006.01)
*B60L 53/20* (2019.01)

(52) U.S. Cl.
CPC ............ *B60L 53/302* (2019.02); *B60L 53/20* (2019.02); *B60L 53/22* (2019.02); *B60L 53/60* (2019.02); *H05K 7/20927* (2013.01); *B60L 2240/525* (2013.01); *B60Y 2200/91* (2013.01); *B60Y 2300/91* (2013.01); *Y02T 10/70* (2013.01); *Y02T 10/7072* (2013.01); *Y02T 90/12* (2013.01); *Y02T 90/14* (2013.01)

(58) Field of Classification Search
CPC .. B60L 53/302; B60L 53/60; B60L 2240/525; B60L 53/22; B60L 1/02; B60L 3/0046; B60L 1/003; B60L 53/20; B60Y 2300/91; B60Y 2200/91; Y02T 90/14; Y02T 10/7072; Y02T 90/12; Y02T 10/70; H05K 7/20945; H05K 7/20927
USPC ........................................... 320/109; 701/22
See application file for complete search history.

(56) References Cited

U.S. PATENT DOCUMENTS

2013/0069591 A1* 3/2013 Iyasu ................... H02J 7/1461
 320/109
2020/0164718 A1* 5/2020 Takei ..................... B60L 58/26

* cited by examiner

*Primary Examiner* — Zixuan Zhou
(74) *Attorney, Agent, or Firm* — Lempia Summerfield Katz LLC (57) ABSTRACT

A cooling control system and method for an on-board charger of a plug-in vehicle drive an electric water pump using a cooling control map when the temperature of the on-board charger equipped in a plug-in vehicle is equal to or above an overheat prevention temperature. The cooling control system and the method determine an entry of an optimal cooling control mode to cool the on-board charger to a temperature at which charging operational efficiency is maximized when the temperature of the on-board charger is below the overheat prevention temperature. Thereby, the on-board charger is cooled and the standard charging efficiency and the charge depletion fuel economy of the plug-in vehicle is maximized.

17 Claims, 4 Drawing Sheets

FIG. 1

Prior Art

FIG.2

Prior Art

FIG. 3

FIG. 4

COOLING CONTROL SYSTEM AND METHOD FOR AN ON-BOARD CHARGER OF A PLUG-IN VEHICLE

CROSS REFERENCE TO RELATED APPLICATION

The present application claims priority to Korean Patent Application No. 10-2019-0030387, filed Mar. 18, 2019, the entire contents of which is incorporated herein for all purposes by this reference.

BACKGROUND

Field of the Disclosure

The present disclosure relates to a cooling control system and method for an on-board charger of a plug-in vehicle. More specifically, the present disclosure relates to a cooling control system and method for an on-board charger of green vehicles. The system and the method are for cooling an on-board charger equipped in a plug-in vehicle to allow the on-board charger to charge at maximum operational efficiency, thereby improving a standard charging efficiency of the on-board charger.

Description of the Related Art

A plug-in vehicle is a vehicle in which an external power source and an in-vehicle charger are connected via a plug to charge a high-voltage battery in the vehicle. The plug-in vehicle may be mainly a hybrid vehicle or an electric vehicle equipped with a high-voltage battery.

Figure 1:
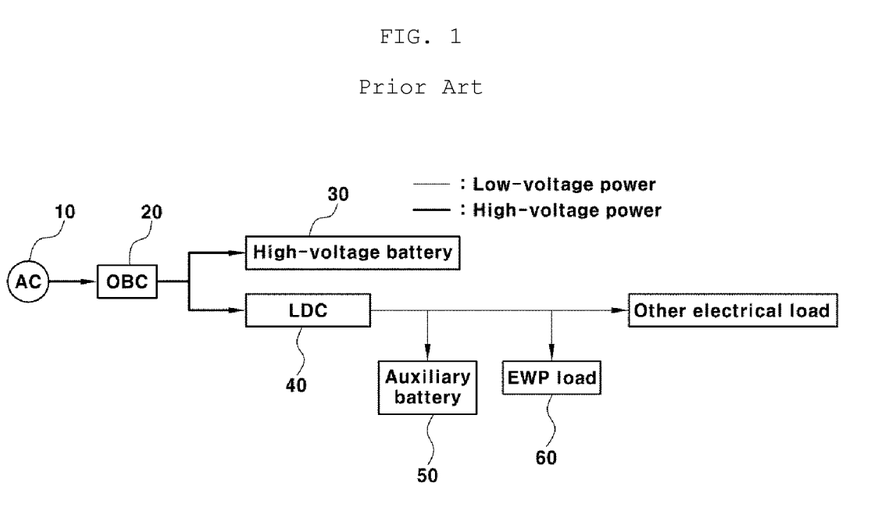
FIG. 1 is a configuration diagram illustrating a charging and power conversion system for a plug-in vehicle according to the related art.

FIG. 1 illustrates a charging and power conversion system for a plug-in vehicle.

An external alternating current (AC) power source 10 and an on-board charger (OBC) 20 mounted on the vehicle are connected to each other via a plug (not illustrated) for charging the plug-in vehicle.

A high-voltage battery 30 to be charged and a low voltage direct current (DC) or DC-DC converter (LDC) 40 are connected to an output side of the OBC 20.

In addition, an auxiliary battery 50 to be charged, an electric water pump (EWP) 60, and other electrical loads are connected to an output side of the LDC 40.

In this example, the OBC 20 converts the AC power of the external AC power source 10 into DC power and charges the high-voltage battery 30 at a standard charging rate.

After the DC power is obtained from the conversion by the OBC 20, the DC power is converted into low voltage power by the LDC 40. Then, the auxiliary battery 50 serving as a power source of the electrical loads or the like is charged with the low-voltage power. The EWP 60 and other electrical loads are supplied with the low-voltage power.

Standard charging efficiency for the high-voltage battery by using the OBC 20 is expressed by the following Equation 1. The fuel economy label of the plug-in vehicle, i.e., the charge depletion (CD) fuel economy of the plug-in vehicle, is expressed by the following Equation 2.

$$\text{Standard Charging Efficiency} = \frac{P2-P4}{P1} = \frac{P2-P4}{\frac{P2}{\eta_{OBC}}} = \eta_{OBC}\left(1-\frac{P4}{P2}\right) \quad \text{Equation 1}$$

$$CD \text{ Fuel Economy} = \eta_{OBC} * \frac{\text{Total distance traveled}}{P3+P4} \quad \text{Equation 2}$$

In the Equations 1 and 2, P1 is AC power output from the external AC power source, P2 is DC power output from the OBC, P3 is DC power charged with the high-voltage battery, P4 is DC power input to the LDC, P5 is DC power converted to low voltage by the LDC, and $\eta_{OBC}$ is operational efficiency of the OBC.

As can be seen from the above Equations 1 and 2, the standard charging efficiency and the CD fuel economy of the plug-in vehicle are increased with the operational efficiency ($\eta_{OBC}$) for charging the OBC and increased as the electrical load consuming power is lowered.

Considering that the operational efficiency of the OBC may be lowered due to heat generated during the charging, cooling of the OBC should be performed to increase efficiency of the OBC.

A coolant is circulated and flows to the OBC 20 by the operation of the EWP 60 to cool the OBC 20.

As the driving revolutions per minute (RPM) of the EWP 60 increases, the consumed power increases. However, the coolant can be rapidly circulated and flow to the OBC, thereby rapidly lowering the temperature of the OBC.

The conventional EWP control method for cooling the OBC does not take into consideration the charging operational efficiency of the OBC, the electric load, or the like. The conventional method is only performed by driving the EWP in consideration of whether the current temperature of the OBC is equal to or greater than the temperature for preventing the OBC from overheating (hereinbelow, referred to as an overheat prevention temperature).

In other words, the conventional method is performed by using a cooling control map data in which the RPM of the EWP is set for each temperature of the OBC.

Figure 2:
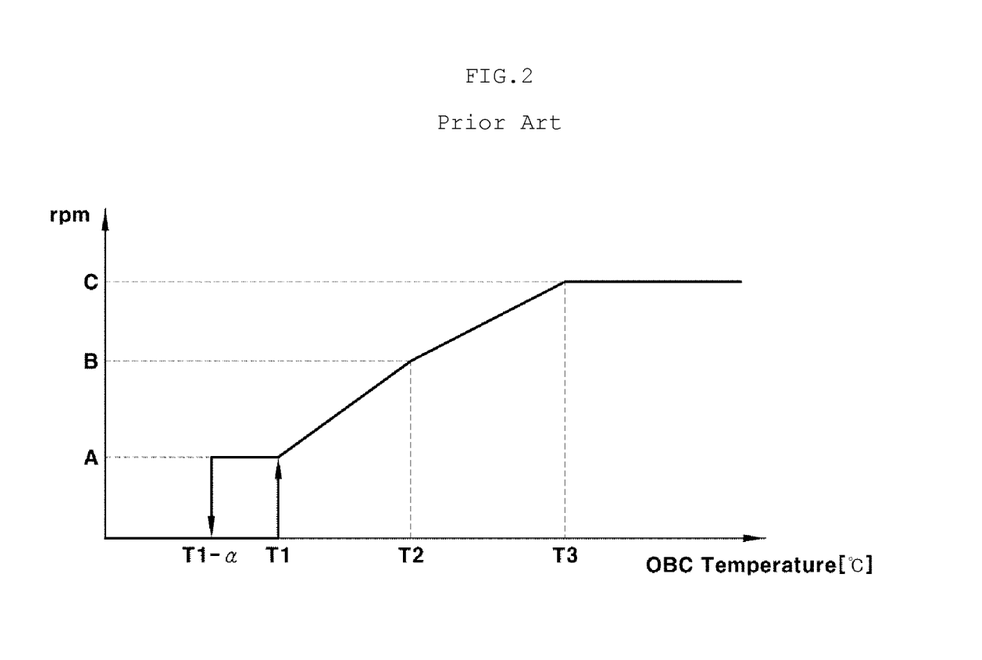
FIG. 2 is a graph illustrating a method of controlling an electric water pump for cooling an on-board charger according to the related art.

For example, as illustrated in FIG. 2, when the temperature of the OBC reaches a first reference temperature T1 of a predetermined temperature or higher, the EWP is operated to a first set RPM (A). When the temperature of the OBC reaches a second reference temperature T2, the EWP is operated to a second set RPM (B) which is higher than the first set RPM (A). When the temperature of the OBC reaches a third reference temperature T3, the EWP is operated to a third set RPM (C) which is higher than the second set RPM (B).

In addition, when the temperature of the OBC reaches the first reference temperature T1, the EWP is continuously operated until the temperature of the OBC is lowered to a temperature T1-α.

As described above, according to the conventional EWP control method for cooling the OBC, the EWP is operated only considering the condition of the current temperature of the OBC without considering the charging operational efficiency of the OBC and the electrical load. It is possible to prevent shortening of the life span of the OBC caused by higher temperatures. However, the operational efficiency of the OBC may vary with temperature. Thus, the charging operational efficiency of the OBC may be reduced by the conventional control method.

In addition, as the driving RPM of the EWP increases, the speed at which the OBC is cooled increases. However, the consumed power (electrical load) of the EWP increases sharply and can be modeled with a quadratic function. In particular, as the temperature of the coolant gradually increases over time due to the heat of the OBC, the cooling effect on the OBC is reduced even when the RPM of the EWP increases.

SUMMARY

Accordingly, the present disclosure is made keeping in mind the above problems occurring in the related art. The present disclosure is intended to provide a cooling control system and method for an on-board charger of a plug-in vehicle. The system and the method drive an electric water pump using a basic cooling control map when the temperature of the on-board charger equipped in a plug-in vehicle is equal to or above an overheat prevention temperature. The system and the method further determine an entry of an optimal cooling control mode to cool the on-board charger to a temperature at which charging operational efficiency is maximized when the temperature of the on-board charger is below the overheat prevention temperature. Thereby, the system and the method easily cool the on-board charger and maximize standard charging efficiency and CD fuel economy of the plug-in vehicle.

In order to achieve the above objective, according to an embodiment of the present disclosure, a cooling control method is provided for an on-board charger (OBC) of a plug-in vehicle. The method includes determining an entry of an optimal cooling control mode to cool an OBC to a temperature at which operational efficiency of the OBC for charging the OBC is maximized. The method further includes calculating the operational efficiency of the OBC at current temperature. The method also includes comparing the operational efficiency of the OBC at the current temperature with a maximum operational efficiency and determining whether the current temperature of the OBC is maximum operational efficiency temperature of the OBC. The method further includes controlling the current temperature of the OBC to a temperature range corresponding to the maximum operational efficiency by controlling an electric water pump (EWP) to be driven, in accordance with the result of determining whether the current temperature of the OBC is the maximum operational efficiency temperature of the OBC.

The determining of the entry of the optimal cooling control mode may include: receiving a standard charge relay ON signal of a host controller at an OBC controller; receiving the current temperature of the OBC provided from a temperature sensor at the OBC controller; and determining the entry of the optimal cooling control mode in the OBC controller on the basis of the received current temperature.

At the determining of the entry of the optimal cooling control mode, a basic cooling control mode may be entered when the current temperature of the OBC is equal to or above an overheat prevention temperature. The optimal cooling control mode may be entered when the current temperature of the OBC is below the overheat prevention temperature.

The operational efficiency of the OBC at the current temperature may be calculated by a calculation unit on the basis of a temperature signal provided from a temperature sensor, an input voltage and input current signal provided from an input voltage and current sensor, and an output voltage and output current signal provided from an output voltage and current sensor.

The calculation unit may calculate the operational efficiency of the OBC at the current temperature by an equation:

$$OBC \text{ Efficiency} = \frac{OBC \text{ output power}}{OBC \text{ input power}} = \frac{OBC \text{ output voltage} * OBC \text{ output current}}{OBC \text{ input voltage} * OBC \text{ input current} * \text{power factor}} * 100$$

The operational efficiency of the OBC at the current temperature which is calculated by the calculation unit may be provided to the OBC controller as data for determining the entry of the optimal cooling control mode.

At the determining whether the current temperature of the OBC is the maximum operational efficiency temperature of the OBC, when the operational efficiency of the OBC at the current temperature is equal to or greater than the maximum operational efficiency of the OBC as a result of comparing by an OBC controller between the operational efficiency of the OBC at the current temperature and the maximum operational efficiency of the OBC, the OBC controller may store the maximum operational efficiency temperature of the OBC as the current temperature of the OBC. The OBC controller may further store the maximum operational efficiency of the OBC as the current operational efficiency of the OBC.

At the determining whether the current temperature of the OBC is the maximum operational efficiency temperature of the OBC, when the operational efficiency of the OBC at the current temperature is below the maximum operational efficiency of the OBC as a result of comparing by an OBC controller between the operational efficiency of the OBC at the current temperature and the maximum operational efficiency of the OBC, the OBC controller may control the current temperature of the OBC to the temperature range corresponding to the maximum operational efficiency of the OBC by means of an on-off control of the electric water pump (EWP).

The controlling of the current temperature of the OBC to the temperature range corresponding to the maximum operational efficiency of the OBC may include: sending a drive command signal from the OBC controller to a motor controller to drive the EWP; driving the EWP under the control of the motor controller; controlling the current temperature of the OBC to the maximum operational efficiency temperature by means of cooling by an operation of the EWP; and checking whether the current temperature of the OBC reaches the maximum operational efficiency temperature by the operation of the EWP.

The controlling of the current temperature of the OBC to the maximum operational efficiency temperature of the OBC may include comparing the current temperature of the OBC with a value (maximum operational efficiency temperature+a hysteresis B) by the OBC controller before the OBC controller sends the drive command signal to the motor controller. The controlling of the current temperature may further include sending the drive command signal from the OBC controller to the motor controller to drive the EWP when the current temperature of the OBC is equal to the value maximum operational efficiency temperature+B) as the result of the comparison. The controlling of the current temperature may also include driving the EWP by the motor controller on the basis of an optimal cooling control map in which RPM of the EWP is set for each temperature of the OBC.

The checking whether the current temperature of the OBC reaches the maximum operational efficiency temperature of the OBC may include comparing the current temperature of the OBC with the value (maximum operational efficiency temperature-B) by the OBC controller during the operation of the EWP. The checking whether the current temperature of the OBC reaches the maximum operational efficiency temperature of the OBC may further include turning off the EWP when the current temperature of the OBC is equal to the value (maximum operational efficiency temperature-B) as a result of the comparison.

In order to achieve the above objective, according to another embodiment of the present disclosure, a cooling control system is provided for an OBC of a plug-in vehicle. The system includes: a temperature sensor measuring temperature of the OBC; an input voltage and current sensor measuring voltage and current input to the OBC; an output voltage and current sensor measuring voltage and current output from the OBC; an OBC controller determining an entry of an optimal cooling control mode for cooling the OBC; and a calculation unit providing the OBC controller with operational efficiency for each temperature as data for determining the entry of the optimal cooling control mode.

The OBC controller may determine whether temperature of the OBC is equal to or above an overheat prevention temperature on the basis of a current temperature signal of the OBC provided from the temperature sensor. The OBC controller may further determine the entry of the optimal cooling control mode for cooling the OBC to a temperature at which the operational efficiency for charging the OBC is maximized.

The calculation unit may calculate the operational efficiency for each temperature of the OBC on the basis of a temperature signal provided from the temperature sensor, an input voltage and an input current signal provided from the input voltage and current sensor, and an output voltage and output current signal provided from the output voltage and current sensor. The calculation unit may further provide the OBC controller with the calculated operational efficiency for each temperature as data for determining the entry of the optimal cooling control mode.

The system may further include a host controller transmitting a standard charge relay ON signal to the OBC controller as a starting point at which the entry of the optimal cooling control mode is determined.

The system may further include a motor controller that drives an EWP on the basis of a cooling control map in which the revolutions per minute (RPM) of the EWP is set for each temperature of the OBC, when there is a drive command signal of the OBC controller.

The present disclosure provides the following effects in accordance with the above technical solution.

According to the present disclosure, when the temperature of an on-board charger equipped in a plug-in vehicle is below the overheat prevention temperature, an optimal cooling control mode is entered to cool the on-board charger to a temperature at which operational efficiency for charging the on-board charger is maximized. Thereby, the on-board charger is easily cooled and the standard charging efficiency and CD fuel economy of the plug-in vehicle are maximized.

In addition, when the temperature of the on-board charger is equal to or above the overheat prevention temperature, the on-board charger is easily protected from overheating by using a basic cooling control map that rapidly increases the RPM of the electric water pump.

BRIEF DESCRIPTION OF THE DRAWINGS

The above and other objects, features and other advantages of the present disclosure should be more clearly understood from the following detailed description when taken in conjunction with the accompanying drawings, in which.

DETAILED DESCRIPTION OF THE DISCLOSURE

Hereinbelow, various embodiments of the present disclosure are described in detail with reference to the accompanying drawings.

Figure 3:
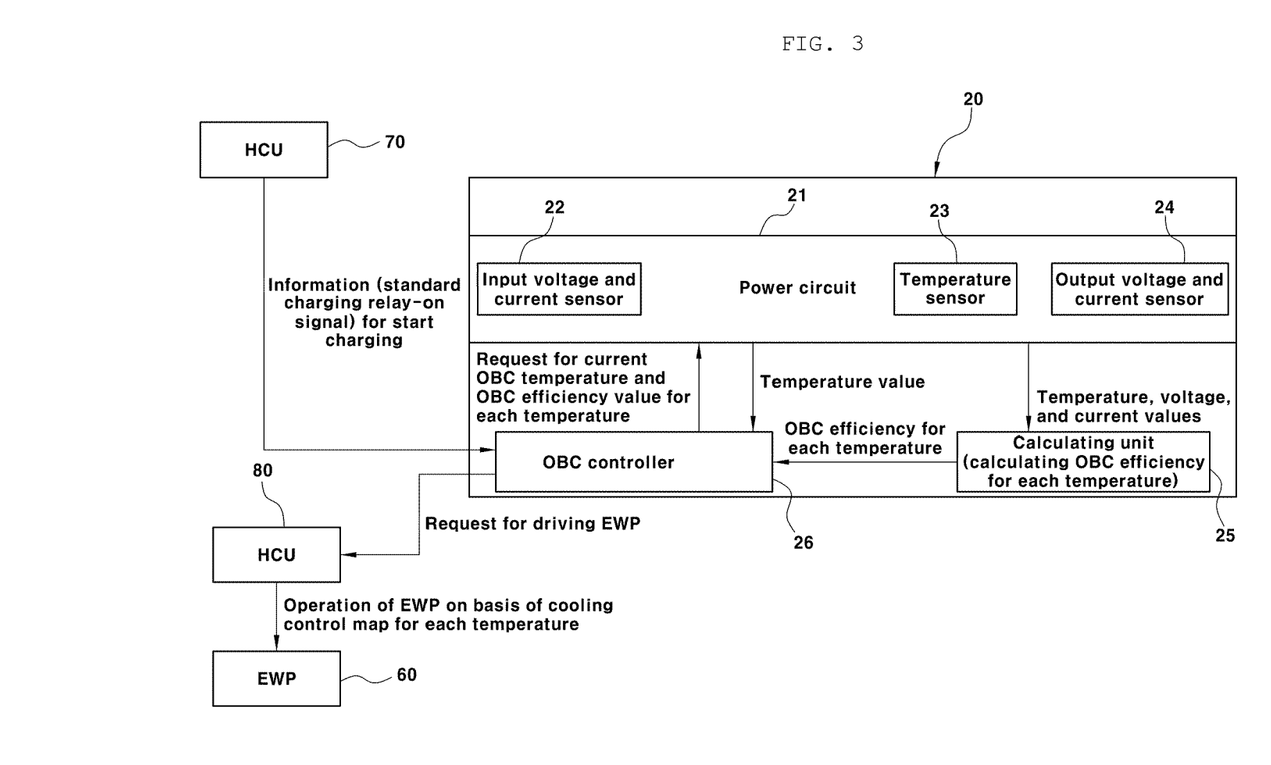
FIG. 3 is a system configuration diagram for a cooling control method for an on-board charger of a plug-in vehicle according to the present disclosure.

The accompanying drawing, FIG. 3, is a system configuration diagram for a cooling control method for an on-board charger (OBC) of a plug-in vehicle according to the present disclosure, wherein reference numeral 20 denotes the OBC equipped in a plug-in vehicle.

The OBC 20 includes a power circuit 21 converting alternating current (AC) power supplied from an external AC power source to direct current (DC) power. The OBC 20 further includes a temperature sensor 23 measuring temperature of the OBC 20. The OBC 20 also includes an input voltage and current sensor 22 measuring voltage and current input to the OBC 20. The OBC 20 further includes an output voltage and current sensor 24 measuring voltage and current output from the OBC 20.

In addition, the OBC 20 may further include a calculation unit 25 and an OBC controller 26.

The OBC controller 26 determines whether current temperature of the OBC 20 is equal to or above an overheat prevention temperature on the basis of a current temperature signal of the OBC 20 provided from the temperature sensor 23. In particular, the OBC controller 26 determines an entry of an optimal cooling control mode for cooling the OBC 20 to a temperature at which the operational efficiency for charging the OBC 20 is maximized.

The calculation unit 25 calculates an operational efficiency value for each temperature of the OBC 20, on the basis of a temperature signal provided from the temperature sensor 23, an input voltage and input current signal provided from the input voltage and current sensor 22, and an output voltage and output current signal provided from the output voltage and current sensor 24. Then, the calculation unit 25 provides the OBC controller 26 with the operational efficiency value for each temperature, which is calculated as described above, as data for determining the entry of the optimal cooling control mode.

A host controller 70 such as a hybrid control unit (HCU) and a motor controller 80 such as a motor control unit (MCU) are connected to the input side and the output side of the OBC controller 26, respectively.

The host controller 70 serves to transmit a standard charging relay-on signal to the OBC controller 26 as a starting point at which the entry of the optimal cooling control mode is determined.

When there is a drive command signal of the OBC controller 26, the motor controller 80 serves to drive an electric water pump (EWP) 60 on the basis of a cooling control map in which the revolutions per minute (RPM) of the EWP 60 is set for each temperature of the OBC 20.

Hereinafter, a cooling control method for the OBC based on the above-described configuration according to the present disclosure is described.

Figure 4:
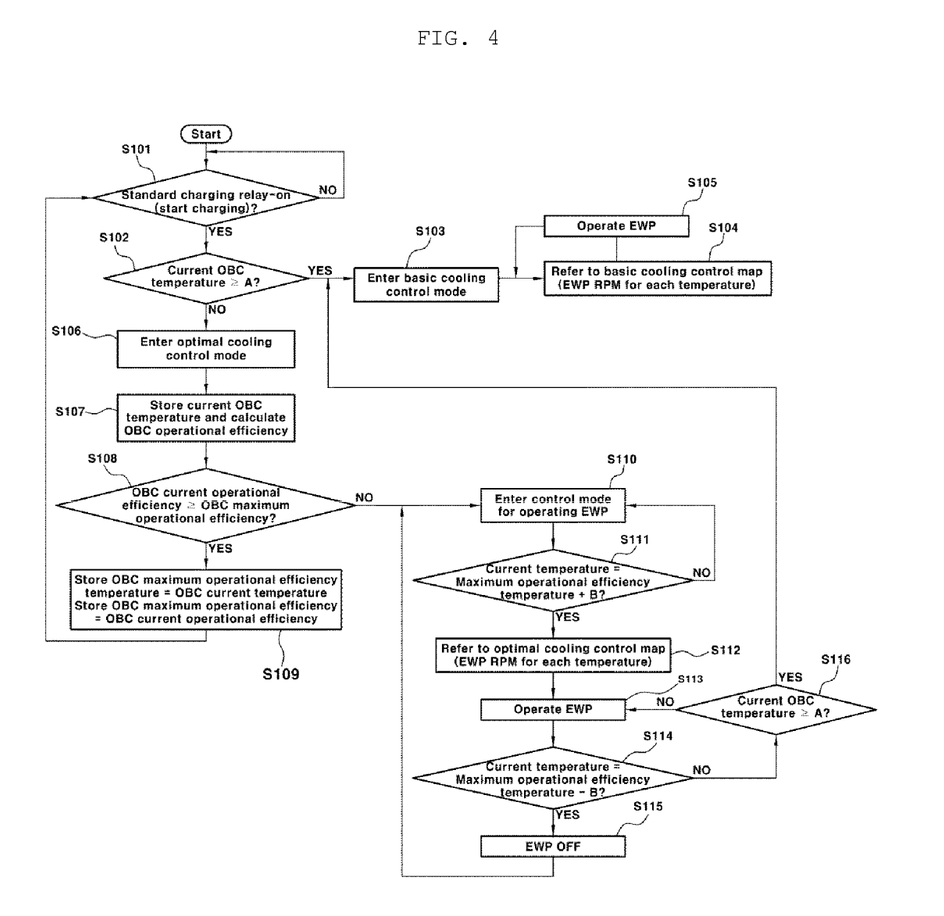
FIG. 4 is a flowchart illustrating the cooling control method for the on-board charger of the plug-in vehicle according to the present disclosure.

The accompanying drawing, FIG. 4, is a flowchart illustrating the cooling control method for the OBC of the plug-in vehicle according to the present disclosure.

The OBC controller 26 determines whether the plug-in vehicle is in a standard-charged state (S101).

In other words, when the OBC controller 26 receives and confirms a standard charging relay-on signal transmitted from the host controller 70, the OBC controller 26 recognizes that the plug-in vehicle is in a standard-charged state.

Then, when the OBC controller 26 recognizes that the plug-in vehicle is in a standard-charged state, the OBC controller 26 determines an entry of the optimal cooling control mode. As a starting step, the OBC controller 26 compares a current temperature of the OBC 20 with the overheat prevention temperature (S102).

In other words, when the temperature signal of the on-board charger measured by the temperature sensor 23 is transmitted to the OBC controller 26, the OBC controller 26 determines whether the current temperature of the OBC 20 is equal to or above the overheat prevention temperature.

When the current temperature of the OBC is equal to or above the overheat prevention temperature A, the OBC controller 26 enters a basic cooling control mode (S103). The OBC controller 26 operates the EWP 60 on the basis of a basic cooling control map data in which the RPM of the EWP 60 is set for each temperature of the OBC 20 (S104 and S105).

More specifically, when the current temperature of the present on-board charger is equal to or above the overheat prevention temperature A, the OBC controller 26 delivers a command signal to the motor controller 80 which drives the EWP 60. Accordingly, the motor controller 80 drives the EWP 60 on the basis of the basic cooling control map data in which the RPM of the EWP 60 is set for each temperature of the OBC 20.

For example, as described above with reference to FIG. 2, the motor controller 80 controls the EWP 60 to be driven on the basis of the basic cooling control map data in which the EWP 60 is operated to a first set RPM (A) when the temperature of the OBC 20 reaches a first reference temperature T1 of a predetermined temperature or higher. The EWP 60 is operated to a second set RPM (B) which is higher than the first set RPM (A) when the temperature of the OBC 20 reaches a second reference temperature T2. The EWP 60 is operated to a third set RPM (C) which is higher than the second set RPM (B) when the temperature of the OBC 20 reaches a third reference temperature T3.

Accordingly, when the temperature of the OBC 20 is equal to or above the overheat prevention temperature A, the RPM of the EWP 60 is increased according to the temperature such that a coolant is rapidly circulated to the OBC, thereby protecting the OBC from overheating and preventing the life span of the OBC from being shortened due to overheat.

Conversely, when it is determined in S102 that the current temperature of the OBC 20 is below the overheat prevention temperature A, the OBC controller 26 enters the optimal cooling control mode for cooling the OBC to a temperature at which the operational efficiency of the OBC is maximized, in consideration of the charging operational efficiency of the OBC for each temperature and electrical load (S106).

After entering the optimal cooling control mode, the OBC controller 26 stores the current temperature of the OBC 20, and an operational efficiency of the OBC at the current temperature is calculated (S107).

More specifically, the OBC controller 26 stores the current temperature of the OBC 20 which is transmitted from the temperature sensor 23. The calculation unit 25 calculates the operational efficiency on the basis of a temperature signal provided from the temperature sensor 23, an input voltage and input current signal provided from the input voltage and current sensor 22, and an output voltage and output current signal provided from the output voltage and current sensor 24.

Preferably, the calculation unit 25 calculates the operational efficiency of the OBC 20 at the current temperature by the following Equation 3.

$$OBC\ \text{Efficiency} = \frac{OBC\ \text{output power}}{OBC\ \text{input power}} = \frac{OBC\ \text{output voltage} * OBC\ \text{output current}}{OBC\ \text{input voltage} * OBC\ \text{input current} * \text{power factor}} * 100 \quad \text{Equation 3}$$

In Equation 3, the power factor is substituted by 0.99.

The operational efficiency of the OBC 20 for each temperature which is calculated by the calculation unit 25 is provided to the OBC controller 26 as data for determining the entry of the optimal cooling control mode.

In addition, after the operational efficiency of the OBC 20 at the current temperature which is calculated by the calculation unit 25 is provided to the OBC controller 26, the operational efficiency of the OBC is utilized as data for comparing with the maximum operational efficiency and determining whether the current temperature of the OBC is the temperature corresponding the maximum operational efficiency of the OBC.

Next, the OBC controller 26 compares a current operational efficiency of the OBC 20 which is transmitted from the calculation unit 25, i.e., the operational efficiency of the OBC at the current temperature, with the maximum operational efficiency.

In other words, the OBC controller 26 compares the operational efficiency of the OBC 20 at the current temperature with the maximum operational efficiency of the OBC, which is already set at the time of manufacturing the OBC product.

In accordance with the result of determining whether the current temperature of the OBC 20 is the temperature corresponding to the maximum operational efficiency of the OBC or, in other words, in accordance with the result of comparing the operational efficiency of the OBC at the current temperature with the maximum operational efficiency of the OBC, a step of controlling the current temperature of the OBC to the temperature corresponding to the maximum operational efficiency may be performed by controlling the EWP 60 to be driven (hereinafter, a drive control for the EWP).

In this embodiment, when the operational efficiency of the OBC 20 at the current temperature is equal to or greater than the maximum operational efficiency of the OBC as a result of the comparison at S108, the temperature corresponding to the maximum operational efficiency of the OBC is stored as the current temperature of the OBC, and the maximum operational efficiency of the OBC is stored as the current operational efficiency of the OBC (S109).

More specifically, when the operational efficiency of the OBC 20 at the current temperature is equal to or greater than the maximum operational efficiency of the OBC as a result of the comparison at S108, the OBC controller 26 determines that the current temperature of the OBC is the temperature (hereinafter, referred to as a maximum operational efficiency temperature) corresponding to the maximum operational efficiency of the OBC and stores the maximum operational efficiency temperature of the OBC as the current temperature of the OBC. At the same time, the OBC controller 26 determines that the current operational efficiency of the OBC 20 is the efficiency corresponding to the maximum operational efficiency of the OBC and stores the maximum operational efficiency of the OBC as the current operational efficiency of the OBC.

Through S108 and S109, it is possible to find the temperature of the OBC 20, which corresponds to the maximum operational efficiency of the OBC, and to control the cooling of the OBC to a temperature range that corresponds to the maximum operational efficiency of the OBC.

Conversely, when the current temperature of the OBC 20 is below the maximum operational efficiency temperature as a result of the comparison in S108, the temperature of the OBC is controlled to be the maximum operational efficiency temperature by means of the drive control for the EWP 60.

In other words, when it is determined in S108 that the current operational efficiency of the OBC is below the maximum operational efficiency of the OBC 20, the OBC controller 26 performs the cooling control in which the temperature of the OBC is controlled to the temperature range corresponding to the maximum operational efficiency by means of an on-off control of the EWP 60.

Accordingly, the OBC controller 26 enters a control mode for operating the EWP 60 (S110) when it is determined that the operational efficiency of the OBC 20 at the current temperature is below the maximum operational efficiency of the OBC.

In this embodiment, when it is determined that the current operational efficiency of the OBC 20 is below the maximum operational efficiency of the OBC, the OBC controller 26 controls to drive the EWP 60 such that the OBC performs the standard charging operation at the maximum operational efficiency temperature.

More specifically, when it is determined that the current operational efficiency of the OBC 20 is below the maximum operational efficiency of the OBC, the OBC controller 26 sends a drive command signal to the motor controller 80 to drive the EWP 60 so that the current temperature of the OBC becomes the maximum operational efficiency temperature. Accordingly, the EWP 60 is driven under the control of the motor controller 80 to cool the OBC 20 by means of coolant circulation such that the current temperature of the OBC can be easily controlled to the maximum operational efficiency temperature stored at S109.

When controlling the current temperature of the OBC 20 to the maximum operational efficiency temperature, it is preferable to set a hysteresis B so as to have a control range, as shown below in Equation 4, such that the current temperature of the OBC is easily controlled to the maximum operational efficiency temperature.

$$\text{(maximum operational efficiency temperature}-B) < \text{(current temperature)} < \text{(maximum operational efficiency temperature}+B)$$

Equation 4

To this end, the OBC controller 26 compares the current temperature of the OBC 20 with value (maximum operational efficiency temperature+B) (S111) before the OBC controller 26 sends the drive command signal to the motor controller 80 to drive the EWP 60.

When the current temperature of the OBC 20 is equal to the value (maximum operational efficiency temperature+B) as the result of the comparison, the OBC controller 26 sends the drive command signal to the motor controller 80 to drive the EWP 60 so that the current temperature of the OBC is lowered to the maximum operational efficiency temperature.

Then, the motor controller 80 controls to drive the EWP 60 on the basis of the optimal cooling control map in which the RPM of the EWP 60 is set for each temperature of the OBC 20 (S112 and S113).

Accordingly, the EWP 60 is operated, thereby cooling the OBC 20 due to the coolant circulation. Thus, the current temperature of the OBC 20 can be easily controlled to the maximum operational efficiency temperature stored at S109.

Thereafter, in order to check whether the current temperature of the OBC 20 reaches the maximum operational efficiency temperature by the operation of the EWP 60, the OBC controller 26 compares the current temperature of the OBC with the value (maximum operational efficiency temperature−B) during the operation of the EWP 60 (S114).

When the current temperature of the OBC 20 is equal to the value (maximum operational efficiency temperature−B) as a result of the comparison, the EWP 80 is turned off (S115).

In other words, when the current temperature of the OBC 20 is equal to the value (maximum operational efficiency temperature−B), the OBC controller 26 sends a command signal to the motor controller 80 to stop the EWP 60 so that the current temperature of the OBC is not further lowered.

As described above, the current temperature of the OBC 20 is controlled to the maximum operational efficiency temperature, preferably, to a range between the value (maximum operational efficiency temperature−B) and the value (maximum operational efficiency temperature+B). Therefore, not only can the OBC 20 be cooled easily, but also the OBC can maintain the maximum operational efficiency for charging, thereby maximizing the standard charging efficiency and the CD fuel economy.

While the current temperature of the OBC 20 is controlled to the maximum operational efficiency temperature by the operation of the EWP 60, when it is determined that the temperature of the OBC is increased above the overheat prevention temperature due to an external factor regardless of the operation of the EWP (S116), the basic cooling control mode is entered for quick cooling of the OBC as described above (S103).

What is claimed is:

1. A cooling control method for an on-board charger (OBC) of a plug-in vehicle, the method comprising:
   determining an entry of an optimal cooling control mode to cool the OBC to a temperature at which operational efficiency of the OBC for charging the OBC is maximized;
   calculating the operational efficiency of the OBC at current temperature;
   comparing the operational efficiency of the OBC at the current temperature with a maximum operational efficiency and determining whether the current temperature of the OBC is maximum operational efficiency temperature of the OBC; and
   controlling the current temperature of the OBC to a temperature range corresponding to the maximum operational efficiency by controlling an electric water pump (EWP) to be driven, in accordance with the result of determining whether the current temperature of the OBC is the maximum operational efficiency temperature of the OBC.

2. The method of claim 1, wherein the determining of the entry of the optimal cooling control mode includes:
receiving a standard charge relay ON signal of a host controller at an OBC controller;
receiving the current temperature of the OBC provided from a temperature sensor at the OBC controller; and
determining the entry of the optimal cooling control mode in the OBC controller on the basis of the received current temperature.

3. The method of claim 2, wherein at the determining of the entry of the optimal cooling control mode,
a basic cooling control mode is entered when the current temperature of the OBC is equal to or above an overheat prevention temperature, and the optimal cooling control mode is entered when the current temperature of the OBC is below the overheat prevention temperature.

4. The method of claim 3, wherein the basic cooling control mode is to drive the EWP on the basis of a basic cooling control map data in which revolutions per minute (RPM) of the EWP is set for each temperature of the OBC.

5. The method of claim 1, wherein the operational efficiency of the OBC at the current temperature is calculated by a calculation unit on the basis of a temperature signal provided from a temperature sensor, an input voltage and input current signal provided from an input voltage and current sensor, and an output voltage and output current signal provided from an output voltage and current sensor.

6. The method of claim 5, wherein the calculation unit calculates the operational efficiency of the OBC at the current temperature by an equation:

$$OBC \text{ Efficiency} = \frac{OBC \text{ output power}}{OBC \text{ input power}} = \frac{OBC \text{ output voltage} * OBC \text{ output current}}{OBC \text{ input voltage} * OBC \text{ input current} * \text{power factor}} * 100.$$

7. The method of claim 5, wherein the operational efficiency of the OBC at the current temperature which is calculated by the calculation unit is provided to the OBC controller as data for determining the entry of the optimal cooling control mode.

8. The method of claim 1, wherein at the determining whether the current temperature of the OBC is the maximum operational efficiency temperature of the OBC,
when the operational efficiency of the OBC at the current temperature is equal to or greater than the maximum operational efficiency of the OBC as a result of comparing by an OBC controller between the operational efficiency of the OBC at the current temperature and the maximum operational efficiency of the OBC, the OBC controller stores the maximum operational efficiency temperature of the OBC as the current temperature of the OBC and stores the maximum operational efficiency of the OBC as the current operational efficiency of the OBC.

9. The method of claim 1, wherein at the determining whether the current temperature of the OBC is the maximum operational efficiency temperature of the OBC,
when the operational efficiency of the OBC at the current temperature is below the maximum operational efficiency of the OBC as a result of comparing by an OBC controller between the operational efficiency of the OBC at the current temperature and the maximum operational efficiency of the OBC, the OBC controller controls the current temperature of the OBC to the temperature range corresponding to the maximum operational efficiency of the OBC by means of an on-off control of the EWP.

10. The method of claim 9, wherein the controlling of the current temperature of the OBC to the temperature range corresponding to the maximum operational efficiency of the OBC includes:
sending a drive command signal from the OBC controller to a motor controller to drive the EWP;
driving the EWP under the control of the motor controller;
controlling the current temperature of the OBC to the maximum operational efficiency temperature by means of cooling by an operation of the EWP; and
checking whether the current temperature of the OBC reaches the maximum operational efficiency temperature by the operation of the EWP.

11. The method of claim 10, wherein the controlling of the current temperature of the OBC to the maximum operational efficiency temperature of the OBC includes:
comparing the current temperature of the OBC with a value (maximum operational efficiency temperature+a hysteresis (B)) by the OBC controller before the OBC controller sends the drive command signal to the motor controller;
sending the drive command signal from the OBC controller to the motor controller to drive the EWP when the current temperature of the OBC is equal to the value (maximum operational efficiency temperature+B) as the result of the comparison; and
driving the EWP by the motor controller on the basis of an optimal cooling control map in which the RPM of the EWP is set for each temperature of the OBC.

12. The method of claim 10, wherein the checking whether the current temperature of the OBC reaches the maximum operational efficiency temperature of the OBC includes:
comparing the current temperature of the OBC with a value (maximum operational efficiency temperature−B) by the OBC controller during the operation of the EWP; and
turning off the EWP when the current temperature of the OBC is equal to the value (maximum operational efficiency temperature−B) as a result of the comparison.

13. A cooling control system for an on-board charger (OBC) of a plug-in vehicle, the system comprising:
a temperature sensor measuring temperature of the OBC;
an input voltage and current sensor measuring voltage and current input to the OBC;
an output voltage and current sensor measuring voltage and current output from the OBC;
an OBC controller determining an entry of an optimal cooling control mode for cooling the OBC; and
a calculation unit providing the OBC controller with operational efficiency of the OBC for each temperature as data for determining the entry of the optimal cooling control mode.

14. The system of claim 13, wherein the OBC controller determines whether temperature of the OBC is equal to or above an overheat prevention temperature on the basis of a current temperature signal of the OBC provided from the temperature sensor and determines the entry of the optimal cooling control mode for cooling the OBC to a temperature at which the operational efficiency for charging the OBC is maximized.

15. The system of claim 13, wherein the calculation unit calculates the operational efficiency for each temperature of the OBC on the basis of a temperature signal provided from the temperature sensor, an input voltage and input current signal provided from the input voltage and current sensor, and an output voltage and output current signal provided from the output voltage and current sensor and provides the OBC controller with the calculated operational efficiency for each temperature as data for determining the entry of the optimal cooling control mode.

16. The system of claim 13, further comprising:
a host controller transmitting a standard charge relay ON signal to the OBC controller as a starting point at which the entry of the optimal cooling control mode is determined.

17. The system of claim 13, further comprising:
a motor controller driving an electric water pump (EWP) on the basis of a cooling control map in which revolutions per minute (RPM) of the EWP is set for each temperature of the OBC, when there is a drive command signal of the OBC controller.

\* \* \* \* \*